United States Patent
Oonishi et al.

(10) Patent No.: US 11,056,415 B2
(45) Date of Patent: Jul. 6, 2021

(54) SEMICONDUCTOR DEVICE (71) Applicant: Hitachi Automotive Systems, Ltd., Hitachinaka (JP)

(72) Inventors: Masami Oonishi, Tokyo (JP); Takashi Hirao, Tokyo (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 176 days.

(21) Appl. No.: 16/330,197

(22) PCT Filed: Jul. 19, 2017

(86) PCT No.: PCT/JP2017/026033
§ 371 (c)(1),
(2) Date: Mar. 4, 2019

(87) PCT Pub. No.: WO2018/047474
PCT Pub. Date: Mar. 15, 2018

(65) Prior Publication Data
US 2019/0229032 A1 Jul. 25, 2019

(30) Foreign Application Priority Data
Sep. 12, 2016 (JP) .............................. JP2016-177229

(51) Int. Cl.
*H01L 23/34* (2006.01)
*H01L 23/367* (2006.01)
(Continued)

(52) U.S. Cl.
CPC ........ *H01L 23/3675* (2013.01); *H01L 23/047* (2013.01); *H01L 23/473* (2013.01);
(Continued)

(58) Field of Classification Search
CPC . H01L 23/047; H01L 23/3675; H01L 23/473; H01L 23/492; H01L 24/48;
(Continued)

(56) References Cited

U.S. PATENT DOCUMENTS 9,165,871 B2    10/2015  Miyanagi
2004/0007772 A1*  1/2004  Arai .................. H01L 25/072
                                                      257/691

(Continued)

FOREIGN PATENT DOCUMENTS

DE   10 2014 115 909 A1   5/2016
JP        2002-110893 A    4/2002
(Continued)

OTHER PUBLICATIONS

International Search Report (PCT/ISA/210) issued in PCT Application No. PCT/JP2017/026033 dated Oct. 10, 2017 with English translation (five (5) pages).

(Continued)

*Primary Examiner* — Nitin Parekh
(74) *Attorney, Agent, or Firm* — Crowell & Moring LLP (57) ABSTRACT

To improve yield and reliability at the time when a plurality of semiconductor elements used for a semiconductor device is arranged in parallel. A semiconductor device according to the present invention includes a first submodule which includes a first semiconductor element sandwiched between a first conductor and a second conductor and a first lead wire which transmits a control signal of the first semiconductor element, a second submodule which includes a second semiconductor element sandwiched between a third conductor and a fourth conductor and a second lead wire which transmits a control signal of the second semiconductor element, a fifth conductor which is formed to cover the first conductor and the third conductor and is bonded to the first (Continued)

conductor and the third conductor, and a sixth conductor which is formed to cover the second conductor and the fourth conductor and is bonded to the second conductor and the fourth conductor, in which the first conductor is formed so as not to overlap with a part of the first lead wire facing a first connection portion to be connected to the second lead wire.

8 Claims, 7 Drawing Sheets

(51) Int. Cl.
| | |
|---|---|
| H01L 23/48 | (2006.01) |
| H01L 25/07 | (2006.01) |
| H01L 25/18 | (2006.01) |
| H02M 7/48 | (2007.01) |
| H01L 23/047 | (2006.01) |
| H01L 23/473 | (2006.01) |
| H01L 23/492 | (2006.01) |
| H01L 23/00 | (2006.01) |
| H02M 7/00 | (2006.01) |
| H02M 7/44 | (2006.01) |

(52) U.S. Cl.
CPC .......... *H01L 23/48* (2013.01); *H01L 23/492* (2013.01); *H01L 24/48* (2013.01); *H01L 25/07* (2013.01); *H01L 25/072* (2013.01); *H01L 25/18* (2013.01); *H02M 7/003* (2013.01); *H02M 7/48* (2013.01); *H01L 2224/48091* (2013.01); *H01L 2224/48227* (2013.01); *H01L 2224/48245* (2013.01); *H01L 2224/48476* (2013.01); *H01L 2924/00014* (2013.01); *H01L 2924/14252* (2013.01); *H02M 7/44* (2013.01)

(58) Field of Classification Search
CPC ..... H01L 25/072; H01L 23/48; H01L 25/075; H01L 2224/48476; H01L 2224/14252; H02M 7/003; H02M 7/44
USPC ................................ 257/713–720, 784, 723
See application file for complete search history.

(56) References Cited

U.S. PATENT DOCUMENTS

| | | | |
|---|---|---|---|
| 2005/0145999 A1* | 7/2005 | Mamitsu | H01L 23/4334 257/667 |
| 2007/0252169 A1* | 11/2007 | Tokuyama | H02M 7/003 257/162 |
| 2009/0201708 A1* | 8/2009 | Ohkouchi | H01L 24/33 363/132 |
| 2013/0175678 A1* | 7/2013 | Ide | H01L 23/4334 257/675 |
| 2013/0221514 A1 | 8/2013 | Otsuka et al. | |
| 2013/0279230 A1* | 10/2013 | Suwa | H05K 7/20927 363/141 |
| 2014/0027891 A1* | 1/2014 | Kimura | H01L 21/561 257/675 |
| 2015/0287665 A1 | 10/2015 | Hanada | |
| 2016/0126212 A1 | 5/2016 | Hohlfeld et al. | |

FOREIGN PATENT DOCUMENTS

| | | |
|---|---|---|
| JP | 2005-228825 A | 8/2005 |
| JP | 2013-175697 A | 9/2013 |
| JP | 2015-211087 A | 11/2015 |
| WO | WO 2012/172991 A1 | 12/2012 |
| WO | WO 2014/046058 A1 | 3/2014 |

OTHER PUBLICATIONS

Japanese-language Written Opinion (PCT/ISA/237) issued in PCT Application No. PCT/JP2017/026033 dated Oct. 10, 2017 (three (3) pages).

German-language Office Action issued in German Application No. 11 2017 003 831.6 dated Mar. 12, 2021 (seven (7) pages).

* cited by examiner

SEMICONDUCTOR DEVICE

TECHNICAL FIELD

The present invention relates to a semiconductor device, and more particularly, to a semiconductor device used for a power converter.

BACKGROUND ART

In recent years, a power converter, used for generating AC from a DC power supply which is required as a driving circuit of a power circuit of a wind power generation facility, a solar power generation facility, an in-vehicle motor, and the like, has been required which can cope with a large current in accordance with an increase in the size of the power generation and an increase in an output of a motor.

However, since the motor can be operated with high efficiency by installing the power converter in the vicinity of the power generation facilities and the power driving devices, request for reducing the size and the weight of these devices has been increased.

A semiconductor device disclosed in PTL 1 is a single module having a structure in which two conductor members sandwich a plurality of semiconductor elements.

On the other hand, according to the request for high output of the power converter, there have been many cases where a plurality of semiconductor elements used for a semiconductor device of the power converter is provided in parallel.

CITATION LIST

Patent Literature

PTL 1: JP 2002-110893 A

SUMMARY OF INVENTION

Technical Problem

An object of the present invention is to improve yield and reliability at the time when a plurality of semiconductor elements used for a semiconductor device is arranged in parallel.

Solution to Problem

To solve the above problem, a semiconductor device according to the present invention includes a first submodule which includes a first semiconductor element sandwiched between a first conductor and a second conductor and a first lead wire which transmits a control signal of the first semiconductor element, a second submodule which includes a second semiconductor element sandwiched between a third conductor and a fourth conductor and a second lead wire which transmits a control signal of the second semiconductor element, a fifth conductor which is formed to cover the first conductor and the third conductor and is bonded to the first conductor and the third conductor, and a sixth conductor which is formed to cover the second conductor and the fourth conductor and is bonded to the second conductor and the fourth conductor, in which the first conductor is formed so as not to overlap with a part of the first lead wire facing a first connection portion to be connected to the second lead wire.

Advantageous Effects of Invention

According to the present invention, it is possible to improve yield and reliability at the time when a plurality of semiconductor elements used for a semiconductor device is arranged in parallel.

BRIEF DESCRIPTION OF DRAWINGS

FIG. 2 is an overall perspective view of a power semiconductor module 101a.

FIG. 3 is an external perspective view of a circuit body 300 obtained by removing a module case 220 and a sealing resin 207 from the power semiconductor module 101a.

FIG. 5A is a perspective developed view of a first submodule 421 and a second submodule 422 included in the power semiconductor module 101a.

DESCRIPTION OF EMBODIMENTS

Embodiments for implementing a semiconductor device according to the present invention will be described with reference to the drawings.

Figure 1:
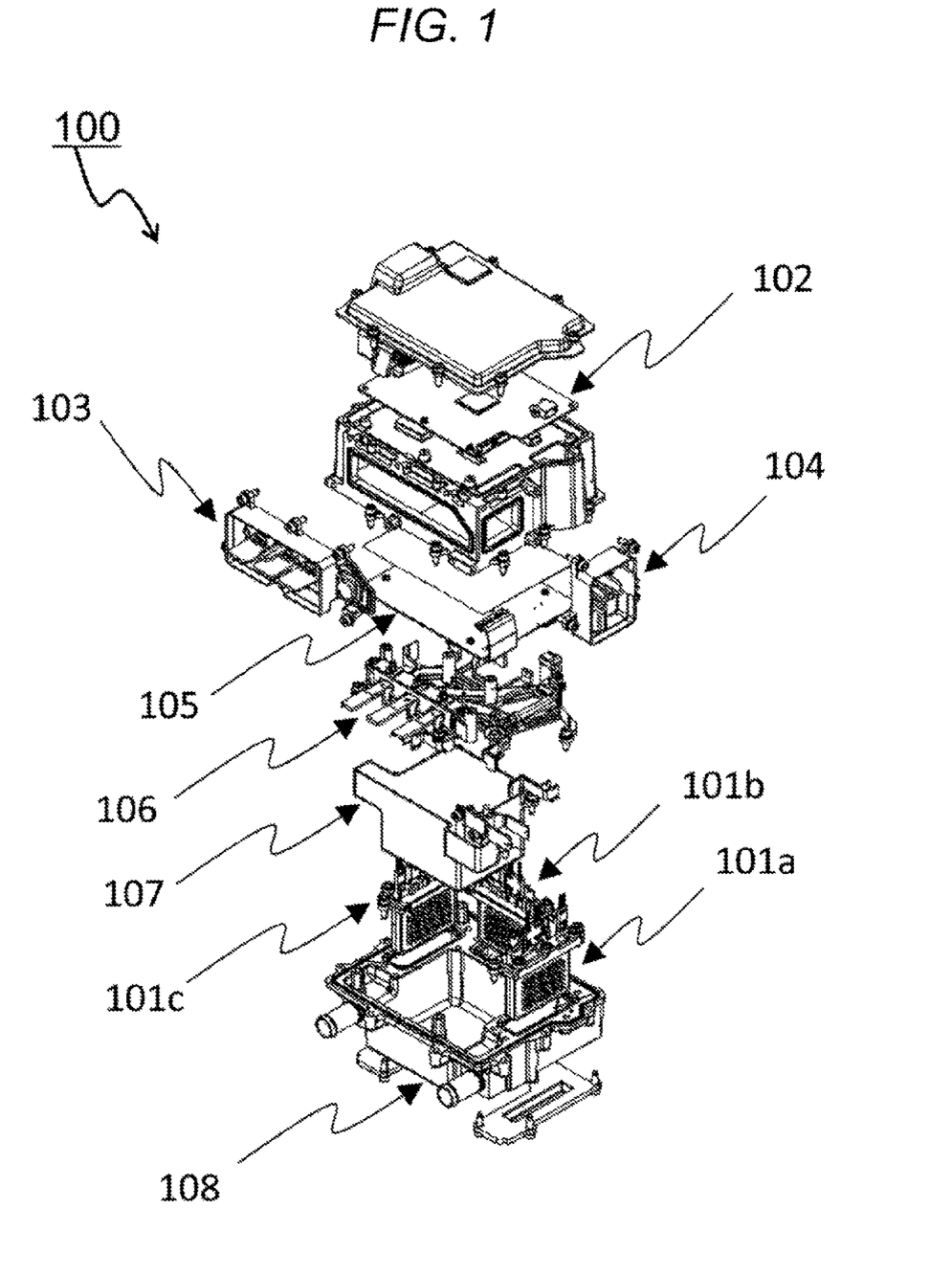
FIG. 1 is a perspective developed view of a power converter 100.

FIG. 1 is a perspective developed view of a power converter 100.

A DC voltage is applied to a DC connector 104, and three power semiconductor modules 101a to 101c convert a DC current into an AC current. The AC current passes through a bus bar 106, and a three-phase AC voltage is output from an AC connector 103. At this time, radio frequency components generated by the three power semiconductor modules 101a to 101c are absorbed by a capacitor 107 so as to suppress fluctuations in a voltage to a battery.

A control board 102 is a control board for motor control and controls the AC voltage generated by the three power semiconductor modules 101a to 101c to a value given by a motor drive command value.

A driving board 105 controls signals for driving the three power semiconductor modules 101a to 101c and controls a voltage output from the AC connector 103 by performing time-control on a gate voltage.

A case 108 serves as a cooling water passage of the power semiconductor modules 101a to 101c and suppresses an increase in the temperature caused by heat generated at the time of switching the power semiconductor modules 101a to 101c.

Figure 2:
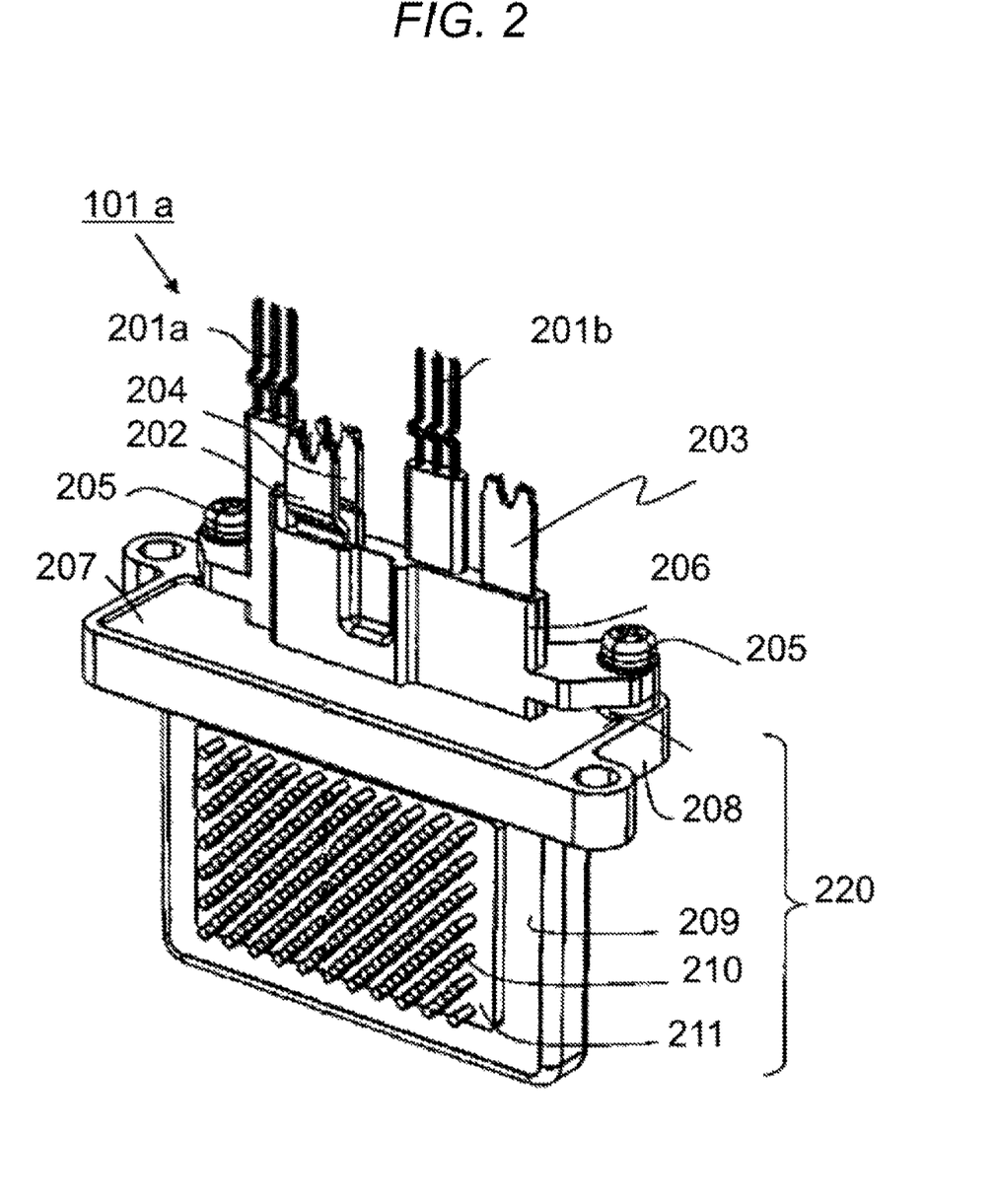

FIG. 2 is an overall perspective view of the power semiconductor module 101a. Since the power semiconductor modules 101b and 101c have the same structure as the power semiconductor module 101a, description thereof will be omitted.

The power semiconductor module 101a includes gate control terminals 201a and 201b, a negative (N) terminal 202 of a DC terminal, a positive (P) terminal 204 of the DC terminal, and an AC terminal 203 for AC output.

The power semiconductor module 101a applies the DC voltage to the N terminal 202 and the P terminal 204 and alternatively inputs driving signals to the gate control terminals 201a and 201b so that the AC terminal 203 outputs the AC voltage.

A wiring insulating portion 206 insulates the gate control terminals 201a and 201b, the N terminal 202 and the P terminal 204 of the DC terminal, and the AC terminal 203 for AC output from each other, and enhances insulation between the terminals.

Furthermore, a semiconductor element for switching to be described later is arranged in the module case 220. A sealing resin 207 enhances insulation properties of the wiring insulating portion 206 and the module case 220.

The module case 220 includes a flange 208, a heat radiation portion 211 in which fins 210 are provided, and a connection portion 209 for connecting the flange 208 and the heat radiation portion 211. Heat generated from the semiconductor element is radiated from the heat radiation portion 211 by water-cooling liquid. The wiring insulating portion 206 is fixed to the module case 220 by a fixing portion 205.

Figure 3:
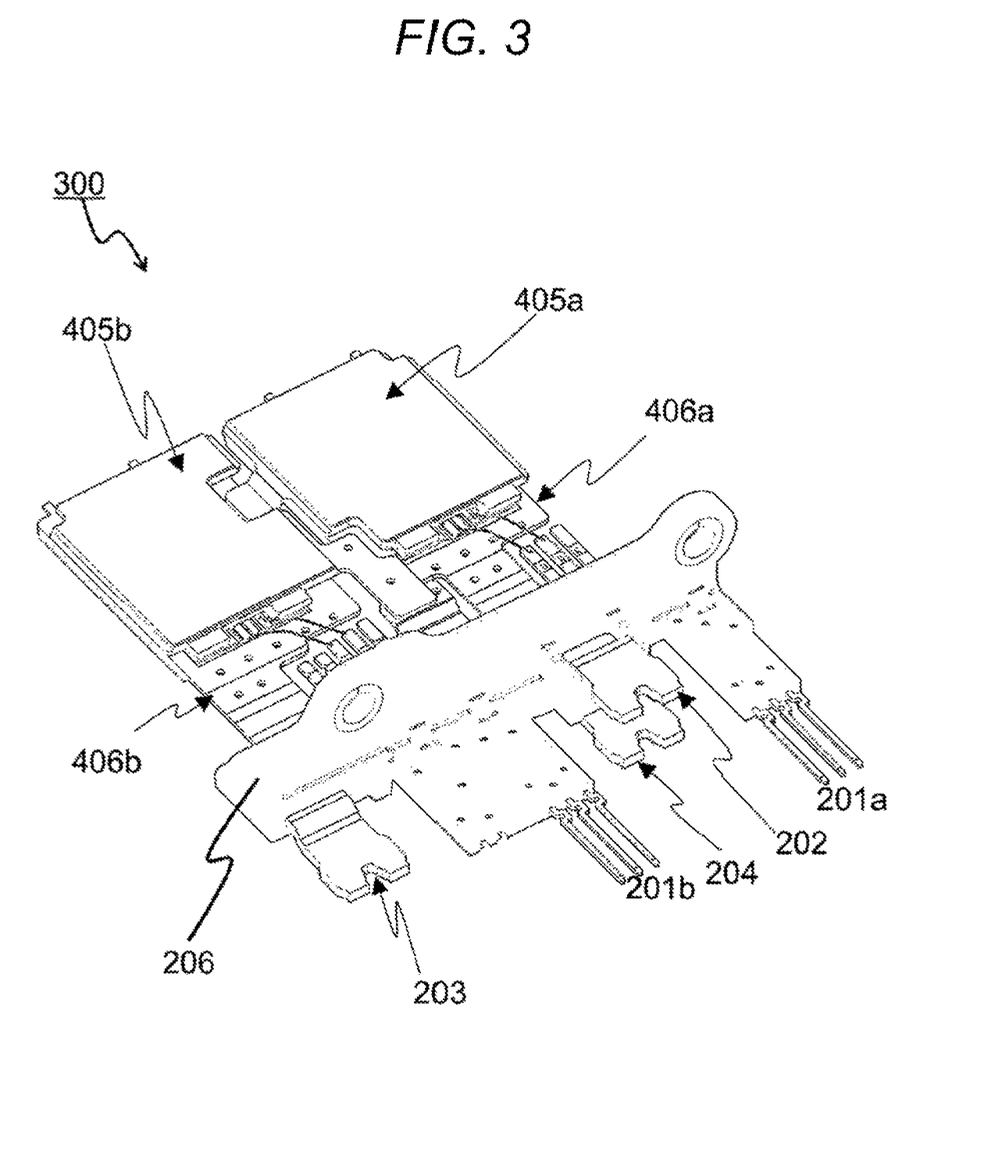
Figure 4:
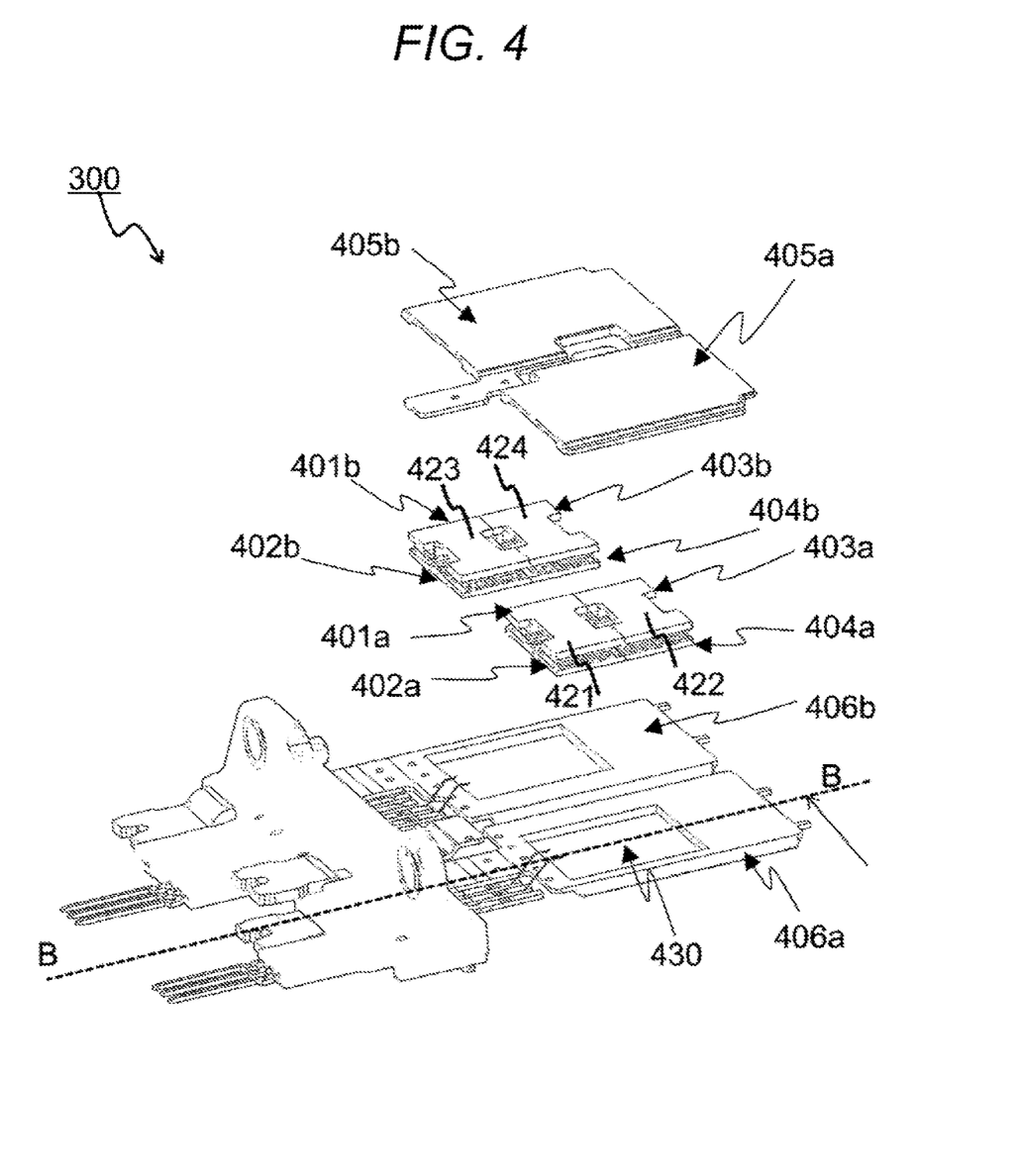
FIG. 4 is a perspective developed view of the circuit body 300.
Figure 5A:
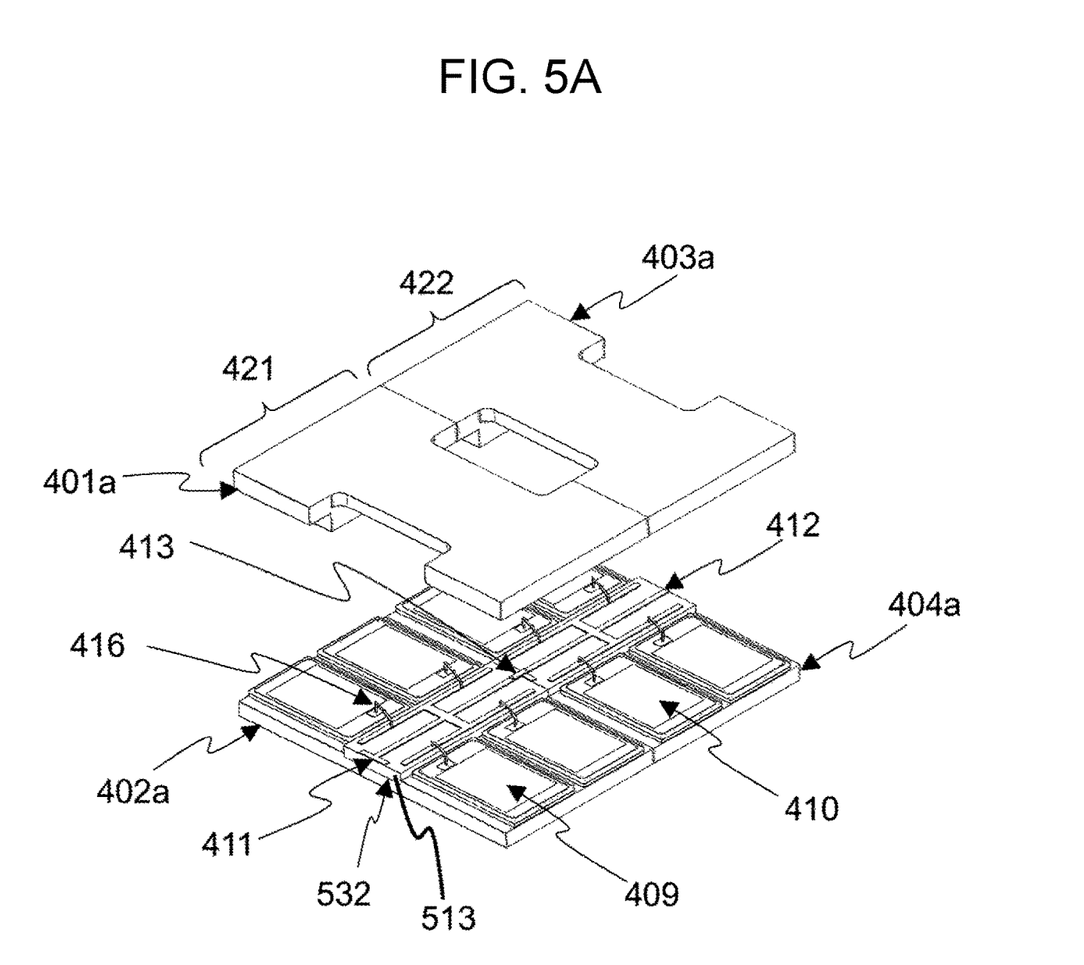
Figure 5B:
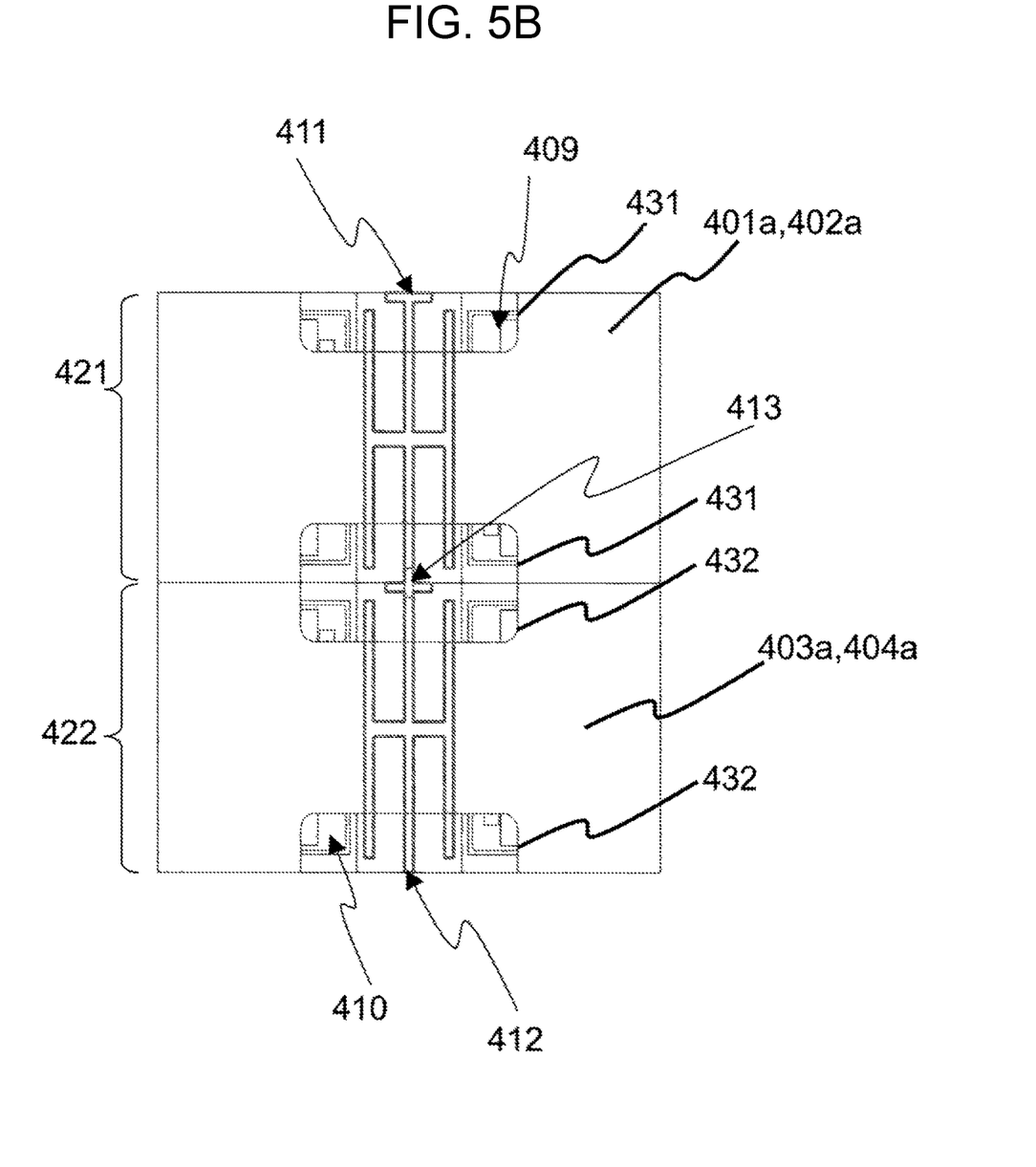
FIG. 5B is a top view of the first submodule 421 and the second submodule 422 illustrated in FIG. 5A.
Figure 6:
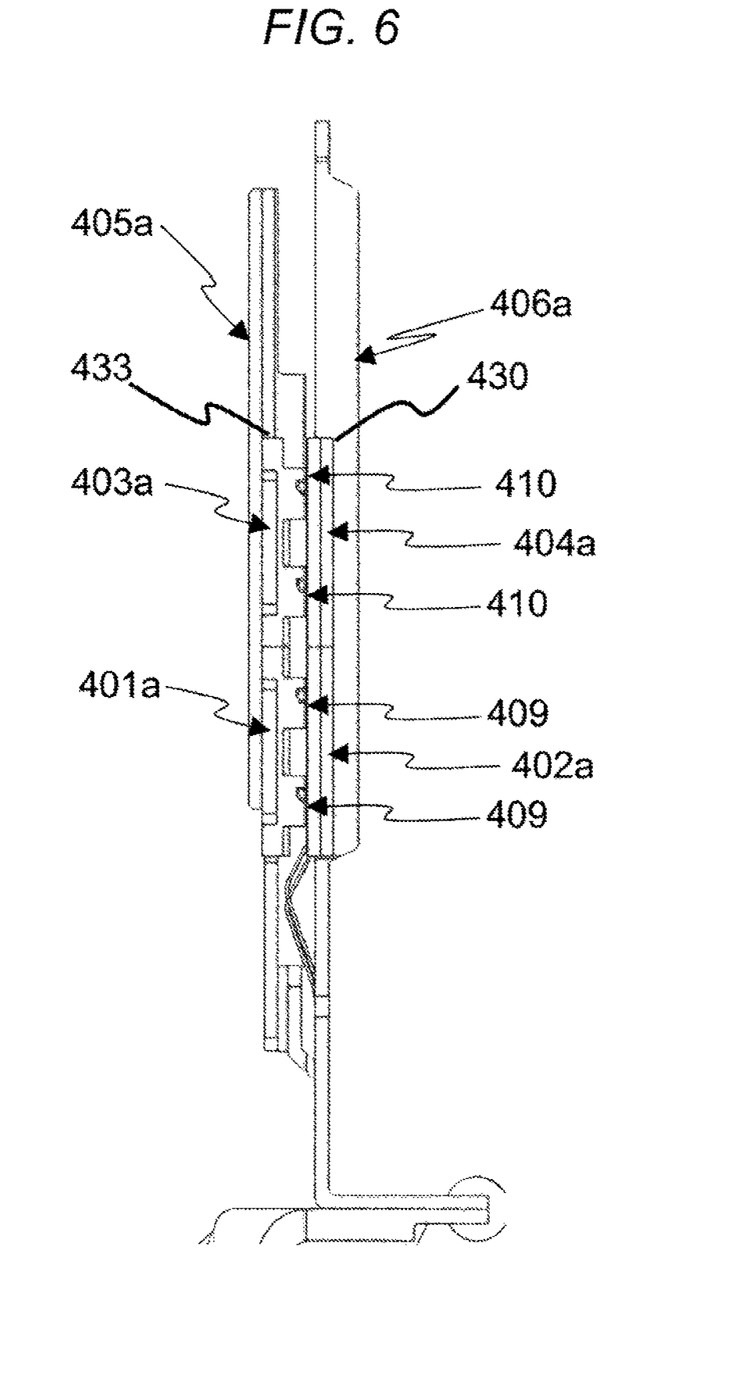
FIG. 6 is a cross-sectional view of a cross section taken along a line B-B in FIG. 4 as viewed from an arrow direction.

FIG. 3 is an external perspective view of a circuit body 300 obtained by removing the module case 220 and the sealing resin 207 from the power semiconductor module 101a. FIG. 4 is a perspective developed view of the circuit body 300. FIG. 5(a) is a perspective developed view of a first submodule 421 and a second submodule 422 included in the power semiconductor module 101a. FIG. 5(b) is a top view of the first submodule 421 and the second submodule 422 illustrated in FIG. 5(a). FIG. 6 is a cross-sectional view of a cross section taken along a line B-B in FIG. 4 as viewed from an arrow direction.

The first submodule 421 illustrated in FIG. 5(a) includes first semiconductor elements 409 sandwiched between a first conductor 401a and a second conductor 402a and a first lead wire 411 which transmits a control signal of the first semiconductor element 409. The first conductor 401a is connected to the first semiconductor element 409 via a solder material. The second conductor 402a is arranged at a position opposed to the first conductor 401a with the first semiconductor element 409 interposed therebetween.

The second submodule 422 includes second semiconductor elements 410 sandwiched between a third conductor 403a and a fourth conductor 404a and a second lead wire 412 which transmits control signals of the second semiconductor element 410. The third conductor 403a is connected to the second semiconductor element 410 via a solder material. The fourth conductor 404a is arranged at a position opposed to the third conductor 403a with the second semiconductor element 410 interposed therebetween.

In the present embodiment, four first semiconductor elements 409 and four second semiconductor elements 410 are provided. However, it is preferable that the number of semiconductor elements be equal to or more than two.

In the present embodiment, the first submodule 421 and the second submodule 422 form an upper arm circuit of an inverter circuit. Since a third submodule 423 and a fourth submodule 424 illustrated in FIG. 4 have the same structures and functions as the first submodule 421, description thereof will be omitted. The third submodule 423 and the fourth submodule 424 form a lower arm circuit of the inverter circuit.

As illustrated in FIG. 5(a), a wire 416 connects the first lead wire 411 and a control electrode of the first semiconductor element 409. A first connection portion 413 connects the first submodule 421 and the second submodule 422.

As illustrated in FIGS. 3 and 4, a fifth conductor 405a is formed to cover the first conductor 401a and the third conductor 403a and is bonded to the first conductor 401a and the third conductor 403a. A sixth conductor 406a is formed to cover the second conductor 402a and the fourth conductor 404a and is bonded to the second conductor 402a and the fourth conductor 404a. For bonding the conductors, for example, a solder material is used.

The third submodule 423 includes a seventh conductor 401b and an eighth conductor 402b, and the seventh conductor 401b and the eighth conductor 402b are arranged to face to each other. The fourth submodule 424 includes a ninth conductor 403b and a tenth conductor 404b, and the ninth conductor 403b and the tenth conductor 404b are arranged to face to each other.

An eleventh conductor 405b is formed to cover the seventh conductor 401b and the ninth conductor 403b and is bonded to the seventh conductor 401b and the ninth conductor 403b. A twelfth conductor 406b is formed to cover the eighth conductor 402b and the tenth conductor 404b and is bonded to the eighth conductor 402b and the tenth conductor 404b. For bonding the conductors, for example, a solder material is used.

By separately forming the first submodule 421 and the second submodule 422, it is possible to measure various electric characteristics and distribution of generated heat in each submodule, and the submodule can be selected. Therefore, it is possible to improve yield and reliability in a case where the plurality of submodules is connected to each other by the fifth conductor 405a and the sixth conductor 406a.

As illustrated in FIG. 5(b), as viewed from an alignment direction of the first conductor 401a and the second conductor 402a, the first conductor 401a includes a first recess 431 of which a part facing the first connection portion 413 is notched. Similarly, the third conductor 403a includes a second recess 432 of which a part facing the first connection portion 413 is notched. That is, as viewed from the alignment direction of the first conductor 401a and the second conductor 402a, outer shapes of the first conductor 401a and the third conductor 403a are formed so as not to overlap with the first connection portion 413.

When the first submodule 421 and the second submodule 422 are arranged to be adjacent to each other, the first recess 431 is connected to the second recess 432, and the first connection portion 413 can be seen through the first recess 431 and the second recess 432. With this structure, electrodes for controlling the first submodule 420 and the second submodule 421 are connected through the first recess 431 and the second recess 432. Accordingly, a connection process becomes easier, and reliability of the connection is improved.

Note that the first recesses 431 are formed on opposing sides the first conductor 401a. Furthermore, the second recesses 432 are formed on opposing sides of the third conductor 403a. Accordingly, even in a case where two second submodules 422 are arranged on both sides of the first submodule 421, connection portion of lead wires of the submodule can be seen through the first recess 431 and the second recess 432. Even in a case where three or more submodules are used, the connection process becomes easier, and the reliability of the connection is improved.

In the present embodiment, as illustrated in FIG. 5(a), the first lead wire 411 is arranged between the two first semiconductor elements 409. This makes it possible to largely reduce a difference in transmission distances of the drive signals to the respective first semiconductor elements 409. Furthermore, heat source can be dispersed, and deterioration in the reliability due to heat concentration can be prevented.

In particular, in the first submodule 420, two rows in each of which the two first semiconductor elements 409 are aligned are provided. The first lead wire 411 is arranged between the two rows. Thus, even in a case where equal to or more than four first semiconductor elements 409 are provided, it is possible to largely reduce the difference between the transmission distances of the drive signals to the first semiconductor elements 409.

The lead wires of the second submodule 421 to the fourth submodule 424 have the similar structure.

As illustrated in FIGS. 4 to 6, the sixth conductor 406a forms a recess 430 for containing the second conductor 402a and the fourth conductor 404a. This makes it possible to improve positioning accuracy at the time of mounting the plurality of submodules and to lower resistance and heat resistance by increasing a connection area.

As illustrated in FIG. 6, the fifth conductor 405a forms a recess 433 for containing the first conductor 401a and the third conductor 403a. This makes it possible to improve positioning accuracy at the time of mounting the plurality of submodules and to lower resistance and heat resistance by increasing a connection area.

As illustrated in FIG. 5(*a*), in the present embodiment, the first lead wire 411 is mounted on a wiring board 513. Note that it is possible that the first lead wire 411 is embedded in the wiring board 513 and the first connection portion 413 is exposed.

The second conductor 402a forms a recess 532 for containing a part of the wiring board 513. Accordingly, the positioning accuracy at the time of mounting the wiring board 513 can be improved, and the difference between the distances of the drive signals to the respective first semiconductor elements 409 can be reduced.

In the present embodiment, the first submodule 420 and the second submodule 421 can form one of the upper and lower arms of the inverter circuit, and an inverter circuit which can increase a current capacity can be formed. Furthermore, by changing the number of parallel submodules, various kinds of current capacities of the inverter can be realized.

REFERENCE SIGNS LIST

100 power converter
101a power semiconductor module
101b power semiconductor module
101c power semiconductor module
102 control board
103 AC connector
104 DC connector
105 driving board
106 bus bar
107 capacitor
108 case
201a gate control terminal
201b gate control terminal
202 N terminal
203 AC terminal
204 P terminal
205 fixing portion
206 wiring insulating portion
207 sealing resin
208 flange
209 connection portion
211 heat radiation portion
210 fin
220 module case
300 circuit body
401a first conductor
401b seventh conductor
402a second conductor
402b eighth conductor
403a third conductor
403b ninth conductor
404a fourth conductor
404b tenth conductor
405a fifth conductor
405b eleventh conductor
406a sixth conductor
406b twelfth conductor
409 first semiconductor element
410 second semiconductor element
411 first lead wire
412 second lead wire
413 first connection portion
416 wire
421 first submodule
422 second submodule
423 third submodule
424 fourth submodule
430 recess
431 first recess
432 second recess
433 recess
513 wiring board
532 recess

The invention claimed is:

1. A semiconductor device comprising:
   a first submodule configured to include a first semiconductor element sandwiched between a first conductor and a second conductor and a first lead wire which transmits a control signal of the first semiconductor element;
   a second submodule configured to include a second semiconductor element sandwiched between a third conductor and a fourth conductor and a second lead wire which transmits a control signal of the second semiconductor element;
   a fifth conductor formed to cover the first conductor and the third conductor and electrically bonded to the first conductor and the third conductor; and
   a sixth conductor formed to cover the second conductor and the fourth conductor and electrically bonded to the second conductor and the fourth conductor, wherein
   the first conductor is formed so as not to overlap with a part of the first lead wire facing a first connection portion electrically connected to the second lead wire.

2. The semiconductor device according to claim 1, wherein
   the third conductor is formed so as not to overlap with a part of the second lead wire facing a second connection portion to be connected to the first lead wire.

3. The semiconductor device according to claim 1, wherein
   the first semiconductor element includes a plurality of semiconductor elements, and
   the first lead wire is arranged at a position sandwiched between the one or more semiconductor elements.

4. The semiconductor device according to claim 3, wherein
   the second semiconductor element includes a plurality of semiconductor elements, and
   the second lead wire is arranged at a position sandwiched between the one or more semiconductor elements.

5. The semiconductor device according to claim 3, wherein the first submodule includes a first wiring board on which the first lead wire is mounted, and the second conductor forms a recess for containing the first wiring board.

6. The semiconductor device according to claim 1, wherein the sixth conductor forms a recess for containing the second conductor and the fourth conductor.

7. The semiconductor device according to claim 6, wherein the fifth conductor forms a recess for containing the first conductor and the third conductor.

8. The semiconductor device according to claim 1, wherein the first submodule and the second submodule form one of upper and lower arms of an inverter circuit.

* * * * *